United States Patent [19]

Noel et al.

[11] Patent Number: 5,084,646
[45] Date of Patent: Jan. 28, 1992

[54] ELECTRIC/ACOUSTIC TRANSDUCERS AND ACOUSTIC/ELECTRIC TRANSDUCERS FOR A SURFACE WAVE DEVICE WITH REDUCED DIFFRACTION AND A CORRESPONDING SURFACE WAVE DEVICE

[75] Inventors: Benoît Noel, Voisins le Bretonneux; Jean-Louis Foure, Verrieres le Buisson, both of France

[73] Assignee: Electronique Serge Dassault

[21] Appl. No.: 497,858

[22] Filed: Mar. 22, 1990

[30] Foreign Application Priority Data

Aug. 10, 1989 [FR] France ................... 89 10785

[51] Int. Cl.$^5$ ............................................. H01L 41/08
[52] U.S. Cl. ............................. 310/313 C; 310/313 B; 333/155
[58] Field of Search ............ 310/313 B, 313 C, 313 D, 310/313 R, 313 A; 333/150, 151, 154, 193, 194, 196, 155

[56] References Cited

U.S. PATENT DOCUMENTS

| | | | |
|---|---|---|---|
| 3,919,669 | 11/1975 | Hartmann | 310/313 B X |
| 3,965,444 | 6/1976 | Willingham et al. | 333/155 |
| 4,499,393 | 2/1985 | Stokes et al. | 310/313 R X |
| 4,697,115 | 9/1987 | Mitsutsuka | 310/313 R |
| 4,947,073 | 8/1990 | Stokes et al. | 310/313 R |

*Primary Examiner*—Mark O. Budd
*Attorney, Agent, or Firm*—Toren, McGeady & Associates

[57] ABSTRACT

The invention concerns electric/acoustic input transducers and acoustic/electric output transducers, in particular for a surface wave device, of the type comprising on a large face of a planar piezoelectric substrate: (i) two conductive input zones or output zones separated by a substrate band over which there extend respective parallel fingers which are interlaced according to a pattern chosen to form a row of fingers along this band, the general direction of the band being inclined to the direction of the fingers; and (ii) electric input means for applying high frequency signals between the zones so as to form sources of surface acoustic waves on the substrate or output means for extracting the signals detected by the device.

At least one of the two conductive input or output zones is subdivided into electrically separated sub-zones, while the electric input means comprise a distributor capable of separately energizing the conductive input zones and while the electric output means comprise a coupler capable of combining the electric signals coming from said output sub-zones.

12 Claims, 3 Drawing Sheets

ELECTRIC/ACOUSTIC TRANSDUCERS AND ACOUSTIC/ELECTRIC TRANSDUCERS FOR A SURFACE WAVE DEVICE WITH REDUCED DIFFRACTION AND A CORRESPONDING SURFACE WAVE DEVICE

FIELD OF THE INVENTION

Surface wave devices are generally used for the processing of high frequency signals with delays that may be dispersive or non-dispersive.

PRIOR ART

To produce these devices, one starts with a thin planar piezo electric substrate. By microlithography or by other micro engineering techniques, a row of thin conductive parallel fingers is deposited on this substrate. By making provision for at least two transducers of this kind, a surface wave device is obtained of which both the input and the output are electric.

The detailed design of these transducers presupposes a compromise between the characteristics desired, on the one hand, electric, and on the other hand, acoustic, taking into account their inherent technological constraints. For example, the expert knows that the width of a finger is in principle a quarter of the length of the acoustic wave which it is intended to process. The length of the fingers will define the size of a sort of "acoustic source" which will radiate in the substrate. More precisely, this finger length defines the aperture of the radiating source constituted by each pair of fingers. This being the case as far as the electric aspect is concerned, when the length of a finger is increased the associated electric capacitance is also increased.

There then arises a problem if it is intended to produce electric-acoustic transducers with a large number of fingers. Either the length of the fingers is reduced, in which case the sources of radiation constituted by the fingers become too small and modes of multiple propagations are met with, resulting in a diffraction phenomenon due to an unduly small acoustic aperture of the transducer, or the length of the fingers is chosen according to the conditions which they are to verify in the acoustic field but then, as regards the electric aspect, in which case the capacitance of the transducer will be considerable and will have a short circuit effect as regards the high frequency signals which are intended to be applied thereto.

OBJECTS OF THE INVENTION

It is a first object of the present invention to provide a solution for this problem.

It is a further object of the invention to provide an improved electric/acoustic input transducer or an acoustic/electric output transducer, in particular for a surface wave device, which comprises, on a large face of a planar piezoelectric substrate:
two conductive input or output zones separated by a substrate band over which there extend respective parallel fingers which are interlaced according to a pattern chosen to form a row of fingers along this band, the general direction of the band being generally inclined to the direction of the fingers, and
electric input means for applying high frequency signals between the zones so as to form sources of surface acoustic waves on the substrate or of the output to extract the signals detected by the device.

It is a still further object of the invention to provide a transducer of the above-mentioned type, in which at least one of the two conductive input or output zones is subdivided into electrically separated sub-zones, while the electric input means comprise a distributor (power divider), capable of separately energizing the input zones and while the electric output means comprise a coupler capable of combining the electric signals coming from the said output sub-zones.

SUMMARY OF THE INVENTION

Applicant has indeed observed that the sub-zones in question define, as regards the electric aspect, a plurality of independent transducers, whilst in the acoustic field, the sub-zones behave as one single transducer. Applicant has also observed that it is possible to energize the independent transducers electrically by power dividers receiving a single input signal, and capable of distributing it in a weighted manner if required, over the various elementary transducers.

The invention applies in particular in the case where the fingers have individual geometries that vary progressively along the substrate strip to cover a wide frequency band; (it is, of course, possible in this case to endow the distributor with a frequency selection function).

Although there is no limit to the number of subzones that can be obtained, Applicant considers at present that several sub-zones, typically three, four or five subzones should be obtained.

A second aspect of the invention applies in the case where the fingers have a variable length along the row, with a view to obtaining a particular acoustic radiation pattern. Applicant has found that this enables different diffraction properties to be derived for the fingers, according to their length and therefore their position in the row. In this case, the distributor obtains a weighted energization (possibly with frequency selection) according to the distribution of the variable length of the fingers.

A preferential weighted transducer application is that of a transducer termed "apodal", having a weighting condition of the type of (sin X)/X. Such a transducer then has a central non-diffractive zone surrounded by two lateral diffractive zones. The sub-zones are then cut out to correspond to each other with a central, generally narrow, sub-zone and two generally wider sub-zones surrounding it and they are energized with an attenuated signal, advantageously by splitting, from the signal energizing the central sub-zone. This also makes it possible to increase the length of the fingers in the lateral zones and hence to limit the diffraction.

Finally, and this represents another aspect of the invention, the distributor can be implanted in the substrate to endow the device with characteristics of independent and modular modes of operation, which is most worthwhile for the applications.

The invention also provides a surface wave device of the type comprising on a large face of a planar piezoelectric substrate:
an electric/acoustic input transducer comprising:
two conductive input zones separated by a substrate band over which there extend respective parallel fingers which are interlaced according to a pattern chosen to form a row of fingers along this band, the general direction of the band being inclined to the direction of the fingers, electric input means for applying high frequency signals between the zones so as to form sources of surface acoustic waves, and an acoustic/electric output transducer comprising: two conductive output zones separated by a substrate band over which there extend respective parallel fingers which are interlaced according to a pattern chosen to form a row of fingers along this band, the general direction of the band being inclined to the direction of the fingers, and electric output means for extracting the signals detected by the device.

According to the invention, at least one of the two conductive zones of each transducer is subdivided into electrically separated sub-zones, and the electric input means comprise a distributor capable of separately energizing the sub-zones associated with the said input transducer, while the electric output means comprise a coupler capable of combining the electric signals coming from the sub-zones associated with the said output transducer.

BRIEF DESCRIPTION OF THE DRAWINGS

Other objects and advantages of the invention will be apparent on examining the following detailed description, and the attached drawings, wherein.

DESCRIPTION OF THE PREFERRED EMBODIMENTS

It is clear that the geometry is very important for the present invention. Moreover, the accompanying drawings are, in essence, of a definite nature. They should, therefore be considered as incorporated in the description and they can serve not only to obtain a better understanding thereof, but also to contribute to the definition of the invention if required.

Figure 1:
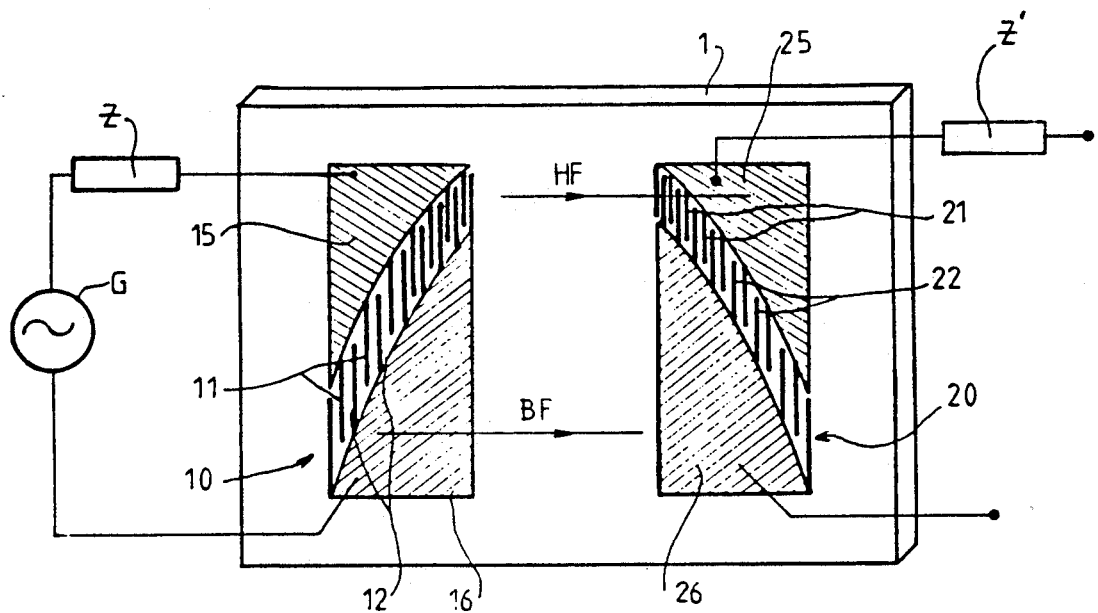
FIG. 1 is a diagram illustrating an example of the devices to which the invention may be applied.

FIG. 1 shows a conventional surface wave device constituted by a piezoelectric substrate 1 whose thickness can be of the order of 0.5 mm. Its other dimensions range from a few millimeters to a few tens of millimeters and even more.

Two rows 10 and 20 of fingers are disposed over a large face of this substrate. Here the finger row 10 is bordered by two electrically separated conductive zones 15 and 16 made, for example, of aluminium approximately 200 nanometers thick. The fingers 11 are connected to the zone 15, while the fingers 12 are connected to the zone 16, on an alternating basis. Similarly, the finger row 20 is provided with zones 25 and 26 to which the fingers 21 and the fingers 22 are respectively connected.

FIG. 1 shows, moreover, that the fingers are closer to each other in the top portion of the finger rows than in the bottom portion. They are also narrower, which is not apparent from the drawing. It follows therefrom that in the top portion of FIG. 1, the coupling between the fingers situated on the same horizontal will take place in the high portion of the frequency range in which the surface wave is operating. On the other hand, at the bottom of FIG. 1, the fingers are more widely interspaced, and their individual widths (in the direction of propagation) are greater. As a result, the coupling will here affect the bottom portion of the frequency range concerned. One thus obtains a dispersive line usually termed "down chirp". The principle also applies to the so-called "up chirp" configuration of dispersive lines, that is to say where the fingers are more closely packed in the bottom part of the transducer than in the top part.

In this kind of device it is important to obtain a localised acoustic propagation between a small part of the emitter-transducer or electric/acoustic input transducer, which is the finger row 10, and a limited part of the receiver transducer or acoustic/electric output transducer which is the finger row 20. In FIG. 1, this corresponds substantially to a horizontal propagation in a straight line between the two rows.

The emitter-transducer which will now be mainly discussed, is here assumed to be formed by the finger row 10. Between its zones 15 and 16, it receives high frequency energization signals coming from a source G through an impedance Z. An impedance Z' connected to the conductive zone 25 makes it possible to obtain the signals detected by the surface wave device formed by the input transducer and the output transducer.

For reasons already explained, difficulties are encountered when the transducer is to comprise a very great number of fingers, for example when it is intended to operate at a high frequency with a considerable dispersion, because the number of fingers is linked to the product of the frequency times the dispersion time, or rather the propagation time from one end of the transducer to the other. Indeed, either the length of the fingers is reduced so as to limit the capacitance between the zones 15 and 16 to prevent the transducer from acting as a short circuit device in relation to the generator and this provides acoustic diffraction phenomena, or else a good acoustic aperture is retained to prevent the occurrence of the acoustic diffraction phenomena, in which case, the capacitance between the zones 15 and 16 is high, and the major part of the power of the generator will then be absorbed in the series impedance Z and will be therefore lost to the electric/acoustic transduction.

In a twin-transducer device such as that of FIG. 1, the two finger rows 10 and 20 are inclined in relation to the main direction of propagation of the acoustic waves (the horizontal). This is why these structures are frequently called SLT for "SLanted Transducer" or have even retained their old name of "slanted acoustic correlator" or SAC.

Figure 2:
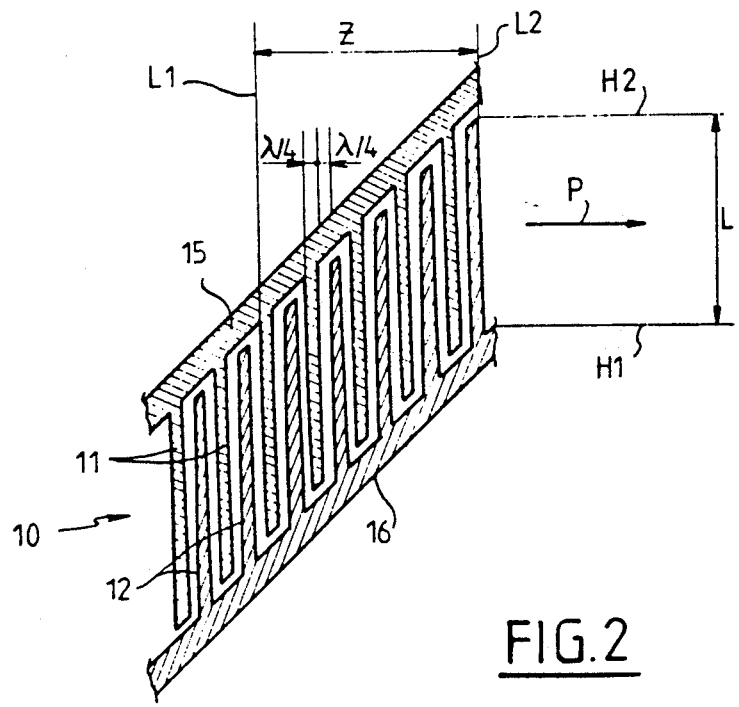
FIG. 2 illustrates a so-called single finger structure, to form a row of electric/acoustic transducers for a surface wave device.

FIG. 2 illustrates in greater detail an example of the row of fingers that can be used in the structure of FIG. 1.

In fact, the finger rows such as 10 and 20 comprise a very high number of fingers which will, moreover, as has already been seen, have characteristics which are modified in a progressive manner from one end of the row to the other.

Indeed, FIG. 2 thus only represents a local portion of a transducer showing, between the schematically indicated zones 15 and 16, the fingers 11 attached to the zone 15 and the fingers 12 attached to the zone 16. In this local section, both the width of the fingers in the propagation direction P and the gap between the fingers in this same direction are equal to one quarter of the length of the instantaneous (local) acoustic wave.

The aperture of the acoustic radiation is linked to the length L of the fingers taken individually. However, as regards the acoustic aspect, it will be considered in general that it is the set of the finger portions of row 10 that is situated between the horizontal lines H1 and H2 and generally, the vertical lines L1 and L2 which will participate in the emission of the acoustic wave in the direction P which is the median axis of the zone delimited by the horizontal lines H1 and H2. This is the source of the problem already referred to, that is to say, if the height L of the fingers decreases, one is then no longer concerned with a directional acoustic radiation but rather with an acoustic radiation along several directions, due to the diffraction phenomena between the emission slits.

As has already been indicated, if on the other hand the finger length desired for acoustic reasons is maintained then the total capacitance of the transducer proper will then attain values such that its output will be very low, because the impedance of the transducer will be very different from that of the generator.

The technical constraints resulting from these phenomena are usually measured by the expert in the form of the product of the band width times the maximum permitted dispersion time. At present, B.T. products equal to approximately 400 are obtained.

The expert will understand that the present invention allows this characteristic product to be reasonably increased by a factor of approximately five.

Figure 3:
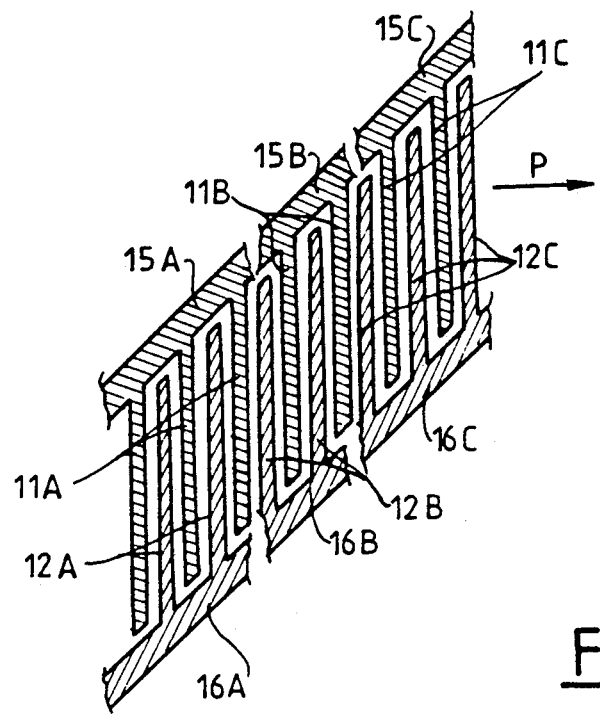
FIG. 3 illustrates the device of FIG. 2, modified according to the present invention.

FIG. 3 represents the same pattern as FIG. 2, but cut out according to the invention, that is to say so that the metallic zones 15 and 16 are now divided into subzones 15A, 15B, 15C and 16A, 16B, 16C which correspond to each other in that they have respective interlaced fingers 11A and 12A, 11B and 12B, as well as 11C and 12C.

This illustration of FIG. 3 is given solely to help with the understanding of the invention, subject to the comment that the identical repetition of the fingers such as appearing in FIGS. 2 and 3 does not conform to the real position for the reasons already indicated.

In practice, the expert will observe first of all that the fingers have in principle transverse width dimensions that will change and lengths that will also change, as is apparent in FIG. 1.

Moreover the subdivision, according to the invention, into zones need only be effected on one side of the row of fingers because this is sufficient to allow the electric separation of the elementary transducer into a plurality of "sub-transducers".

Figure 4:
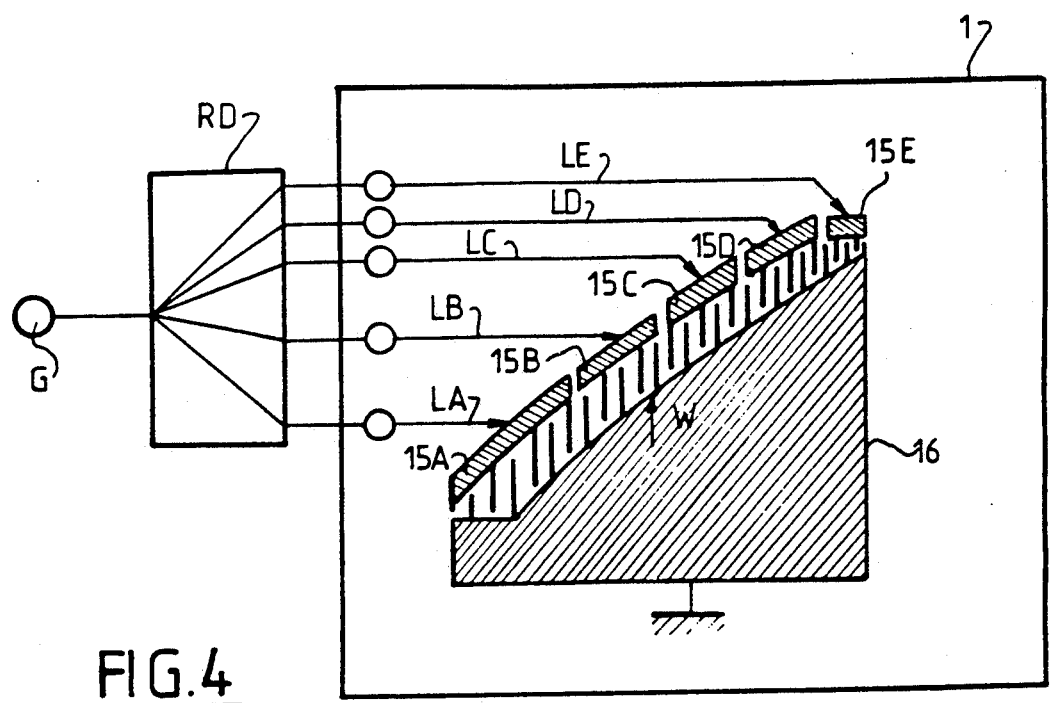
FIG. 4 schematically illustrates a first example of application of the invention.

Consequently, the basic lay-out of the invention has the structure illustrated in FIG. 4 showing the substrate 1 which is earthed as a whole and has a zone 16 of a somewhat special form. The effective edge of the zone 16 is defined by a curving oblique line terminating towards the bottom in a segment of a horizontal straight line. The other zone is defined by successive segments 15A, 15B, 15C, 15D and 15E of variable length determined by calculation.

From one of the terminals G of the generator, provision is made for a dividing distribution network RD which energizes the contact elements situated on the substrate 1, these individual contact elements being connected by lines LA to LE to the sub-zones 15A to 15E respectively.

The dividing distributor RD can be constituted, for example, by commercial power dividers or by power dividers obtained by a hybrid technology.

The expert will understand that elements thus energized in an electrically independent way behave like five independent transducers as regards the electric aspect but which can, on the other hand, cooperate to form a single transducer as regards the acoustic aspect, and can thus work, for example, with another row of fingers as may be seen in FIG. 1.

It is, moreover, possible but not strictly necessary for the second set of zones 25 and 26 to be arranged like the first, constituting the emitter transducer.

The invention such as described above generally applies to any slanted dispersive transducer, in particular with a wide band width or with a high performance.

It can also be applied very advantageously to a somewhat different class of transducer termed weighted or apodal transducers.

Figure 5:
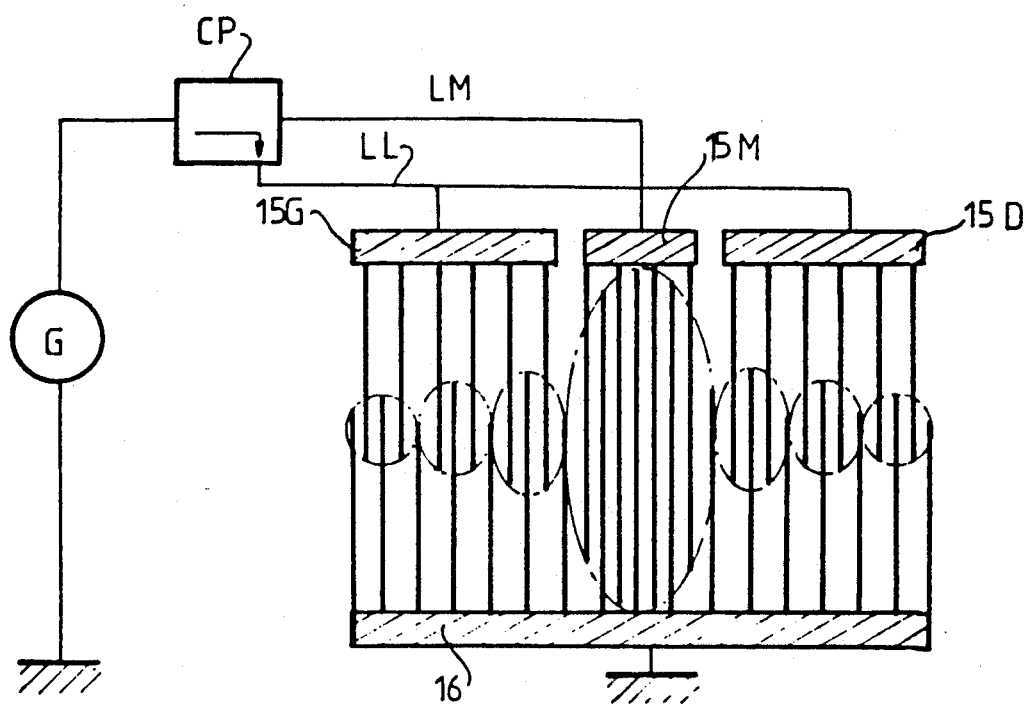
FIG. 5 schematically illustrates a second example of application of the invention.

Such an apodal transducer is schematically illustrated in FIG. 5 showing the improvement of the invention.

A weighted transducer has in general an acoustic emission condition of the type $(\sin X)/X$. That is to say that one obtains in rough outline a shape approximating to a function $(\sin X)/X$ upon tracing the envelope of the ends of the fingers constituting; this shape appears approximately in FIG. 5.

In other words, in FIG. 5 the zones 15 and 16 are separated by fingers which no longer extend practically as far as the other zone but which have, on the contrary, variable lengths to conform to the said condition of the type $(\sin X)/X$.

Applicant has observed that in such a transducer, the central portion produces only slight diffraction, whereas the side portions, whose zones of cooperation between the fingers are shorter, produce a stronger diffraction.

The application of the invention to structures of this type is then effected as follows:

The non-diffractive central zone is associated with a sub-zone 15M of narrow width (parallel to the other zone 16). The lateral zones which are more diffractive, can be enlarged towards the fingers by a factor N and be energized by the generator via an attenuation coupler CP. Thus the main zone 15M will be energized by a line LM passing through the main channel of a coupler CP connected with leakage to the signal generator G. The leakage line of this same coupler CP is applied to a line LL which at the same time energizes the two lateral sub-zones 15G and 15D. The attenuated energization of the sub-zones 15G and 15D is compensated by a larger acoustic aperture.

Thus a very advantageous weighted transducer is obtained where the acoustic diffraction effect is greatly attenuated.

The distributor of energy between the various sub-zones can be advantageously incorporated in the substrate itself by using hybrid couplers or couplers with distributed elements according to techniques well known in high frequency applications.

It should be observed that the invention applies to any weighting condition and not solely to that of the type $(\sin X)/X$.

Generally speaking, the present invention can be applied to single fingers, to binary fingers or to any sequence for the attachment of the fingers. In other words, the width of a finger is substantially a predetermined submultiple of the half length of the acoustic wave associated with the frequency which is intended to be processed by this finger, whilst the distance between adjacent fingers is substantially equal to this submultiple or a multiple thereof. Where the first submultiple is concerned, this gives a quarter of the wave length for the width of one finger and the same value or a multiple thereof for the distance between adjacent fingers (the multiple value remaining in principle only an incidental factor). If the submultiple is of the order of two, one then obtains one eighth of the wave length and the other dimension is therefore also modified as a result.

The present invention is, of course, not limited to the embodiment described but extends to any variant in accordance with its spirit.

We claim:

1. An acousto-electric transducer for a surface wave device, comprising:
   (a) a piezoelectric substrate having a planar main face;
   (b) transducing means comprising:
      (i) a row of adjacent parallel conductive fingers spread over said planar main face along a general line of extension which is inclined to the direction of the fingers,
      (ii) a pair of electrode means extending on either side of said conductive fingers,
      (iii) each of said fingers being connected to either one or the other of said electrode means,
      (iv) said fingers having geometries and being arranged according to a preselected distribution scheme to define a given arrangement of fingers and interfinger spacings along said general line of extension,
      (v) said transducing means being capable of converting electrical signals across said electrodes into surface acoustic waves propagating on said planar main face, or vice-versa;
      (vi) at least one of said pair of electrode means being subdivided into electrically separated sub-electrodes,
   (c) electric interface means coupled across said pair of electrode means and comprising means for simultaneous coupling to each of said sub-electrodes.

2. A transducer according to claim 1, wherein the electric interface means comprises individual connections to each of the sub-electrodes, and means for connecting a single signal source or a single load simultaneously to all of the individual connections.

3. A transducer according to claim 1, wherein said fingers are parallel to each other, and have individual geometries which vary progressively along said row to cover a wide frequency bandwidth.

4. A transducer according to claim 3, wherein the width of one said finger is substantially a predetermined submultiple of half the instantaneous wavelength of the associated acoustic wave, while the interfinger spacing is substantially equal to this submultiple.

5. A transducer according to claim 1, wherein the number of sub-electrodes be at least three.

6. A transducer according to claim 1, wherein the number of sub-electrodes is at least four.

7. A transducer according to claim 1, wherein the number of sub-electrodes is at least five.

8. A transducer according to claim 1, wherein said fingers have different lengths along said row in order to obtain a particular acoustic radiation pattern, and said distributor means is coupled to said sub-electrodes in different manners accommodating the distribution of said different lengths of said fingers.

9. A transducer according to claim 8, wherein the length distribution of said fingers is chosen to form a weighted transducer having a central acoustically non-diffractive zone surrounded by two lateral acoustically diffractive zones, and wherein said distributor means provides said lateral zones with a coupling which is attenuated with respect to that of said central zone.

10. A transducer according to claim 9, wherein said coupling of the lateral zones is derived from that of said central zone via distributed members formed on said main face of said piezoelectric substrate.

11. A transducer according to claim 1, wherein said distributor is formed on said main face of said piezoelectric substrate.

12. A surface wave device, comprising:
   (a) a piezoelectric substrate having a planar main face;
   (b) a first transducing means comprising:
      (i) a first row of parallel conductive fingers spread over said planar main face along a first general line of extension which is inclined to the direction of the fingers,
      (ii) a first pair of electrode means extending on either side of said first row of conductive fingers,
      (iii) each of said fingers being connected to either one or the other of said electrode means,
      (iv) said fingers having geometries and being arranged according to a first preselected distribution scheme to define a given arrangement of fingers and interfinger spacings along said first general line of extension,
      (v) said first transducing means being capable of converting electrical signals across said first electrode means into surface acoustic waves propagating on said planar main face,
   (c) a second transducing means comprising:
      (i) a second row of parallel conductive fingers spread over said planar main face along a second general line of extension which is inclined to the direction of the fingers,
      (ii) a second pair of electrode means extending on either side of said second row of conductive fingers,
      (iii) each of said fingers being connected to either one or the other of said second pair of electrode means,
      (iv) said fingers of said second row having geometries and being arranged according to a second preselected distribution scheme to define a given arrangement of fingers and interfinger spacings along said second general line of extension,
      (v) said second transducing means being capable of converting surface acoustic waves propagating on said planar main face from said first transducer means into electrical signals,
   (d) first electric interface means coupled across said first pair of electrode means;
   (e) second electric interface means coupled across said second pair of electrode means;
   (f) at least one of said first pair of electrode means being subdivided into a first set of electrically separated sub-electrodes, and said first electric interface means comprising first means for simultaneous coupling to each of said sub-electrodes in said first set, and
   (g) at least one of said second pair of electrode means being subdivided into a second set of electrically separated sub-electrodes, and said electric interface means comprising second means for simultaneous coupling to each of said sub-electrodes in said second set.

* * * * *

UNITED STATES PATENT AND TRADEMARK OFFICE
CERTIFICATE OF CORRECTION

PATENT NO.    : 5,084,646

DATED         : 28 January 1992

INVENTOR(S)   : Benoit Noel, et al.

It is certified that error appears in the above-identified patent and that said Letters Patent is hereby corrected as shown below:

ON THE TITLE PAGE

Item [73], Assignee - Please add:   Electronique Serge Dassault, Saint Cloud, France Signed and Sealed this Twentieth Day of July, 1993

Attest:

MICHAEL K. KIRK

*Attesting Officer*     *Acting Commissioner of Patents and Trademarks*